United States Patent
Kalla et al.

(10) Patent No.: US 11,881,280 B2
(45) Date of Patent: Jan. 23, 2024

(54) CIRCUIT AND METHOD FOR CONSTANT SLEW RATE IN HIGH VOLTAGE CHARGE PUMPS

(71) Applicant: STMicroelectronics International N.V., Geneva (CH)

(72) Inventors: Shivam Kalla, Bikaner (IN); Vikas Rana, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/534,136

(22) Filed: Nov. 23, 2021

(65) Prior Publication Data

US 2022/0172751 A1     Jun. 2, 2022

Related U.S. Application Data

(60) Provisional application No. 63/119,435, filed on Nov. 30, 2020.

(51) Int. Cl.
| | |
|---|---|
| G05F 3/02 | (2006.01) |
| G05F 1/10 | (2006.01) |
| G11C 5/14 | (2006.01) |
| G11C 11/56 | (2006.01) |
| H02M 1/00 | (2006.01) |
| H03K 5/24 | (2006.01) |
| G05F 3/26 | (2006.01) |
| H02M 3/07 | (2006.01) |
| G11C 16/30 | (2006.01) |

(52) U.S. Cl.
CPC .............. G11C 5/145 (2013.01); G05F 3/262 (2013.01); G11C 5/147 (2013.01); G11C 11/5635 (2013.01); G11C 16/30 (2013.01); H02M 1/0003 (2021.05); H02M 3/07 (2013.01); H03K 5/24 (2013.01)

(58) Field of Classification Search
CPC ......... G11C 5/145; H02M 3/07; H02M 3/071; H02M 3/072; H02M 3/073; H02M 3/075; H02M 3/076; H02M 3/077
USPC ........................................................ 327/536
See application file for complete search history.

(56) References Cited

U.S. PATENT DOCUMENTS

| | | | | |
|---|---|---|---|---|
| 4,488,060 A | * | 12/1984 | Simko | G11C 5/145 327/134 |
| 6,107,862 A | | 8/2000 | Mukainakano et al. | |
| 6,462,527 B1 | * | 10/2002 | Maneatis | H03L 7/18 323/315 |
| 6,566,847 B1 | * | 5/2003 | Chou | G05F 1/46 363/59 |
| 6,724,241 B1 | * | 4/2004 | Bedarida | H02M 3/07 327/536 |
| 6,861,895 B1 | * | 3/2005 | Liu | H01L 27/0802 257/E27.047 |
| 6,980,047 B1 | * | 12/2005 | Kuo | G11C 16/30 327/544 |

(Continued)

*Primary Examiner* — Quan Tra

(74) *Attorney, Agent, or Firm* — Seed IP Law Group LLP

(57) ABSTRACT

An integrated circuit includes a non-volatile memory, a charge pump that generates high voltages for programming operations of the non-volatile memory array, and a charge pump regulator that controls a slew rate of the charge pump. The charge pump regulator generates a sense current indicative of the slew rate and adjusts a frequency of a clock signal provided to the charge pump based on the sense current.

18 Claims, 7 Drawing Sheets

(56) References Cited

U.S. PATENT DOCUMENTS

| | | |
|---|---|---|
| 7,348,829 B2 | 3/2008 | Choy et al. |
| 7,365,585 B2 | 4/2008 | Fort et al. |
| 7,633,778 B2 | 12/2009 | Mok et al. |
| 7,639,067 B1 * | 12/2009 | Perisetty ............... G05F 1/56 326/41 |
| 7,928,796 B2 * | 4/2011 | Namekawa ........... H02M 3/073 327/535 |
| 8,310,300 B2 | 11/2012 | Cook et al. |
| 8,525,582 B2 * | 9/2013 | Matsubara .............. G05F 3/262 327/543 |
| 8,797,089 B2 * | 8/2014 | Suzuki .................. G11C 16/30 327/536 |
| 2005/0168263 A1 * | 8/2005 | Fukuda ................ H02M 3/073 327/535 |
| 2008/0042727 A1 * | 2/2008 | Goetz ................... G11C 16/30 327/536 |
| 2015/0145591 A1 * | 5/2015 | Fischer ................. H02M 3/07 327/536 |

\* cited by examiner

CIRCUIT AND METHOD FOR CONSTANT SLEW RATE IN HIGH VOLTAGE CHARGE PUMPS

BACKGROUND

Technical Field

The present disclosure is related to non-volatile memories, and more particularly to the generation of program and erase voltages for the non-volatile memories.

Description of the Related Art

Many non-volatile memories include floating gate transistors that act as the data storage elements of the non-volatile memory cells. Data is written to or erased from the memory cells by adding or removing electrons from the floating gates of the floating gate transistors by a process known as Fowler-Nordheim tunneling. Fowler-Nordheim tunneling is achieved, in part, by applying a high voltage between the control gate of the floating gate transistor and the source terminal of the floating gate transistor.

If a high voltage is applied for too long during a program or erase cycle, then the durability of the non-volatile memory cell may be adversely impacted. If the high voltage is applied for too short a duration then the efficiency and data retention properties of the memory cell may also be adversely impacted. In order to obtain good program and erase efficiency, the magnitude and duration of voltages applied are carefully selected.

Nevertheless, other factors related to the application of program and erase functions can also adversely impact the memory cells. For example, charge pumps are typically utilized to generate the high voltages for the program and erase operations. The slew rate of the output voltage of the charge pump can affect the program and erase cycles.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide a charge pump regulator that controls a charge pump during program and erase operations of a non-volatile memory. The charge pump regulator ensures that the output of the charge pump has characteristics that will result in efficient and effective program and erase operations. In particular, the charge pump regulator monitors the change in the output voltage of the charge pump and uses feedback principles to ensure that the rate of change (slew rate) of the output voltage falls within a desired range.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
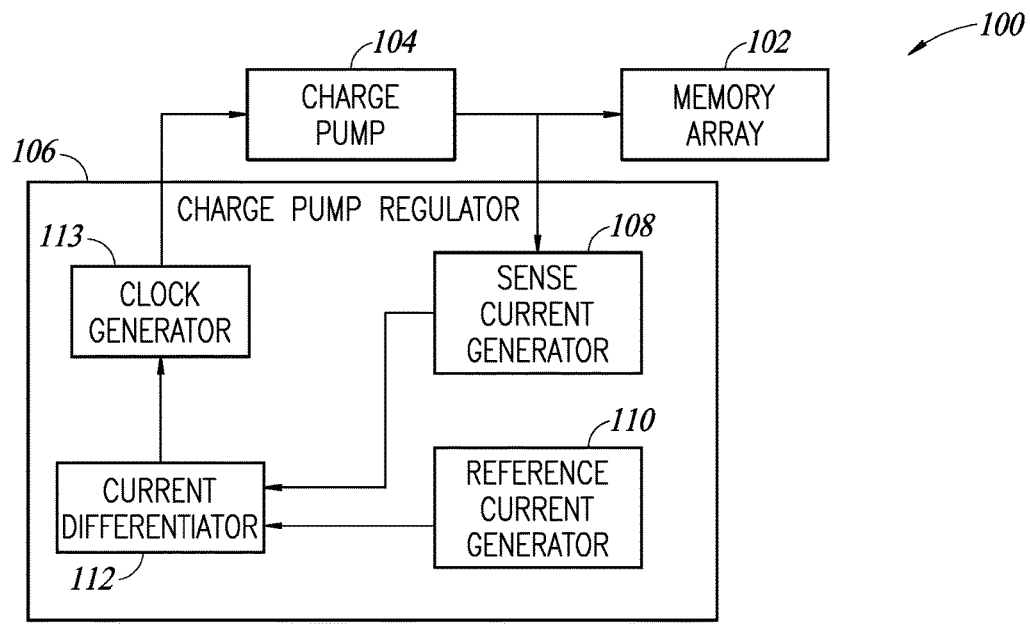
FIG. 1 is a block diagram of an integrated circuit including a charge pump regulator, according to one embodiment.

FIG. 1 is a block diagram of an integrated circuit 100, according to one embodiment. The integrated circuit 100 includes a memory array 102, a charge pump 104, and a charge pump regulator 106. The charge pump 104 of the charge pump regulator 106 cooperate to ensure efficient and effective memory program and erase operations of the memory array 102.

The memory array 102 is a non-volatile memory array including a plurality of memory cells. In one example, the memory cells include floating gate transistors. The floating gate transistors have floating gates. Data is stored in or erased from a floating gate by applying a high voltage between a control gate of the floating gate transistor and a source terminal of the floating gate transistor. Electrons tunnel through the channel of the floating gate transistor to the floating gate or from the floating gate to the channel, as the case may be, to program data or erase data from the floating gate. The tunneling process is known as Fowler-Nordheim tunneling. While the present disclosure primarily describes embodiments in which the memory array 102 is a non-volatile memory array and the memory cells include floating gate transistors as storage devices, other types of memory arrays and memory cells can be utilized without departing from the scope of the present disclosure. Furthermore, principles of the present disclosure can extend to memory arrays other than non-volatile memory arrays.

The charge pump 104 generates a high voltage for the program and erase operations of the memory cells of the memory array 102. Typically, the charge pump 104 receives a clock signal having an amplitude of VDD and a selected frequency and generates a high voltage for the program and erase operations. In one embodiment, the charge pump 104 includes a plurality of charge pump stages. Each charge pump stage adds VDD to the output of the previous charge pump stage. If the first charge pump stage receives VDD as an input, then the first charge pump stage outputs 2*VDD as an output. The second charge pump stage receives 2*VDD from the first charge pump stage and outputs 3*VDD. This continues until the final charge pump stage outputs the output voltage Vout of the charge pump 104. In one example, Vout is between 15 V and 20 V.

When a program or erase operation is to be performed, the charge pump 104 initially has an output voltage of 0 V or the supply voltage VDD. The output voltage then ramps up to the desired output voltage for the program or erase operation. The initial ramp up time of the output of the charge pump 104 is factored into the total time utilized for a program or erase operation. Accordingly, if the ramp up time is very slow, then the program and erase operation is correspondingly slow. However, if the ramp up time is too fast, this can cause other problems in the program or erase operation, such as over-program or over-erase of memory cells. The change in the output voltage versus time is known as the slew rate of the charge pump 104. A high slew rate corresponds to a rapidly changing output voltage. A low slew rate corresponds to a slowly changing output voltage.

One of the conditions that affects the slew rate is the load of the charge pump. The load corresponds to the amount of current utilized in a program or erase operation. In addition to current load, there is a capacitive load that is charged by the charge pump. If a program or erase operation is to be performed on only a single row of memory cells, then the load current and load capacitance are relatively small. If a program or erase operation is to be performed on multiple rows of memory cells, the load current and load capacitance are relatively large. The total load can be modeled as a load capacitor and a load current source, as will be set forth in more detail below. In general, higher loads lead to lower slew rates or greater resources needed to provide higher slew rates. In general, smaller loads lead to higher slew rates or fewer resources needed to provide higher slew rates.

Another condition that affects the slew rate is the frequency of the clock signal provided to the charge pump 104. As set forth above, the charge pump 104 receives the clock signal with an amplitude of VDD and a selected frequency and generates the high output voltage. The generation of the high output voltage from an input amplitude of VDD is accomplished, in part, based on the switching of the clock signal between high and low values. The faster switching, or in other words the higher the frequency of the clock signal, the higher the slew rate of the charge pump 104. The lower the frequency of the clock signal, the lower the slew rate of the charge pump 104.

The charge pump regulator 106 regulates the slew rates of the charge pump 104. The charge pump regulator 106 is coupled to the output of the charge pump 104. The charge pump regulator 106 detects the slew rate of the charge pump 104 and adjusts the function of the charge pump 104 to achieve a desired slew rate.

The charge pump regulator 106 includes a sense current generator 108. The sense current generator 108 is coupled to the output of the charge pump 104. The sense current generator 108 generates a sense current based on the slew rate of the output voltage of the charge pump 104.

The charge pump regulator includes a reference current generator 110. The reference current generator 110 generates a reference current. The reference current has a value selected to be used for comparison with the sense current, as will be described in more detail below.

The charge pump regulator includes a current differentiator 112. The current differentiator 112 receives the sense current from the sense current generator 108 and the reference current from the reference current generator 110. The current differentiator 112 generates a difference current corresponding to the difference between the sense current and the reference current. Accordingly, the difference current can provide an indication of adjustments that should be made to the slew rates of the charge pump 104.

The charge pump regulator 106 includes a clock generator 113. The clock generator 113 generates the clock signal that is provided to the charge pump 104. The clock signal has an amplitude of VDD and a selected frequency. As set forth above, the frequency of the clock signal controls, in part, the slew rate of the charge pump 104.

The charge pump regulator 106 receives the difference current from the current differentiator 112. The charge pump generator adjusts the clock signal provided to the charge pump 104 responsive to the difference current received from the currents differentiator 112. The adjustments to the clock signal results in an adjustment to the slew rate of the output voltage of the charge pump 104.

In one example, the sense current generator 108 generates a sense current that is greater than the reference current generated by the reference current generator 110. This may indicate that the slew rate of the charge pump 104 is too high. The current differentiator 112 generates a difference current indicating that the sense current is higher than the reference current. The clock generator 113 receives the difference current and reduces the frequency of the clock signal provided to the charge pump 104. The reduction in the frequency of the clock signal causes the slew rate of the charge pump 104 to decrease.

In another example, the sense current generator 108 generates a sense current that is lower than the reference current generated by the reference current generator 110. The current differentiator 112 generates a difference current indicating that the sense current is lower than the reference current. The clock generator 113 receives the difference current and increases the frequency of the clock signal provided to the charge pump 104. The increase in the frequency of the clock signal causes the slew rate of the charge pump 104 to increase.

The slew rate of the charge pump 104 is continuously sensed and adjusted during operation of the charge pump 104. If the slew rate drops below a desired value or outside the desired range, then the charge pump regulator 108 increases the frequency of the clock signal. If the slew rate increases above the desired value or outside a desired range, then the charge pump regulator 108 decreases the frequency of the clock signal. This feedback mechanism maintains the output of the charge pump 104 at the desired value or within the desired range.

The clock generator 113 can adjust the output of the charge pump 104 in ways other than simply decreasing the frequency of the clock signal. For example, the clock generator 113 can periodically interrupt the clock signal to either reduce the slew rate or reduce the total output voltage. Accordingly, the clock generator 113 can regulate both the slew rate and the magnitude of the output voltage of the charge pump 104.

The charge pump regulator 106 includes a sense current generator 108, a reference current generator 110, a current differentiator 112, and clock generator 113. The sense current generator 108 generates a sense current that is indicative of the slew rate of the charge pump 104. The sensor generator 108 provides a sense current to the current differentiator 112. The reference current generator 110 generates a reference current. The reference current generator 110 provides the reference current to the current differentiator 112. The current differentiator 112 compares the sense current to the reference current.

Figure 2:
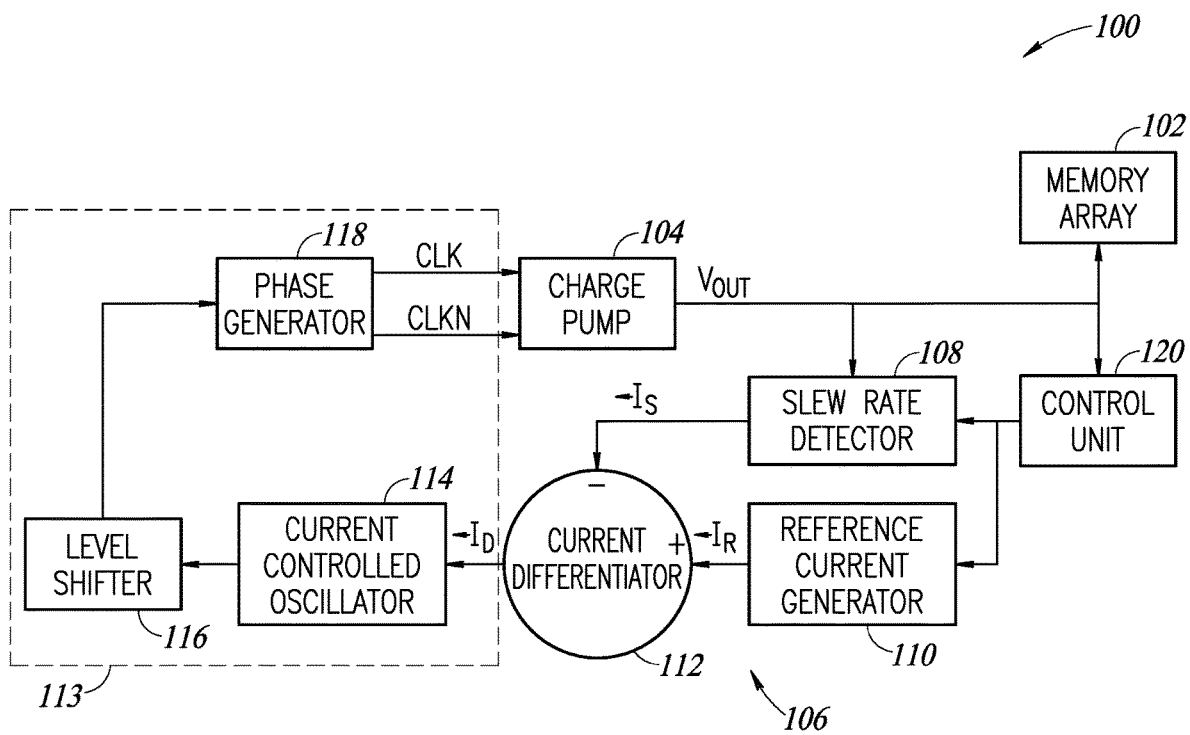
FIG. 2 is a block diagram of an integrated circuit including a charge pump regulator, according to one embodiment.

FIG. 2 is a block diagram of an integrated circuit 100, according to one embodiment. The integrated circuit 100 of FIG. 2 is similar to the integrated circuit 100 of FIG. 1 in many regards. The integrated circuit 100 includes a memory array 102, the charge pump 104, and the charge pump regulator 106.

The charge pump regulator 106 includes a sense current generator 108, a reference current generator 110, and a current differentiator 112. The sense current generator 108 is coupled to the output of the charge pump 104. The sense current generator 108 generates a sense current IS based on and indicative of the slew rate of the output voltage Vout of the charge pump 104. The reference current generator 110 generates a reference current IR. The current differentiator 112 receives the sense current IS and the reference current IR and generates a difference current ID indicative of the difference between the sense current IS and the reference current IR.

The integrated circuit 100 includes a clock generator 113. The clock generator 118 generates a clock signal CLK and a complementary clock signal CLKN. The clock signal CLK and complementary clock signal CLKN have a same frequency. The complementary clock signal CLKN is the logical complement of the clock signal CLK. When CLK is high, CLKN is low. When CLK is low, CLKN is high.

The clock generator 113 includes a current controlled oscillator 114. The current control oscillator 114 is coupled to the current differentiator 112. The current control oscillator 114 receives the difference current ID from the current differentiator 112. The current control oscillator 114 generates an oscillating signal with a frequency based on the difference current ID. The magnitude of the difference current ID controls the frequency of the oscillating signal output by the current control oscillator. The shape of the oscillating signal generated by the current control oscillator 114 may be a square wave.

The oscillating signal output by the current control oscillator may have an amplitude that is lower than VDD. This is because the current control oscillator is powered, in part, by the difference current ID. An input voltage of the current control oscillator 114 may be based on a voltage drop caused by the difference current ID. Accordingly, the amplitude of the oscillating signal generated by the current control oscillator 114 may be lower than VDD.

The clock generator 113 includes a level shifter 116 coupled to the current control oscillator 114. The level shifter 116 receives the oscillating signal from the current control oscillator 114. The level shifter 116 shifts the amplitude of the oscillating signal received from the current control oscillator 114 to VDD. Thus, if the oscillating signal generated by the current control oscillator 114 is less than VDD, the level shifter 116 increases the amplitude of the oscillating signal to VDD. The level shifter 116 does not adjust the frequency of the oscillating signal. The level shifter 116 outputs a level shifted oscillating signal. The level shifted oscillating signal corresponds to the oscillating signal of the current control oscillator 114 level shifted to have amplitude of VDD.

The clock generator 113 includes a phase generator 118 coupled to the level shifter 116 and to the charge pump 104. The clock generator 113 receives the level shifted oscillating signal from the level shifter 116. The phase generator 118 generates the clock signal CLK from the level shifted oscillating signal provided by the level shifter 116.

The charge pump regulator 106 includes a control circuit 120. The control circuit 120 can provide control signals to one or both of the sense current generator 108 and the reference current generator 110. In some cases it may be desirable to increase the sensitivity of the sense current generator. In these cases, the control circuit 120 can provide control signals that will cause the sense current generator 108 to generate larger sense currents IS for a given slew rate of the output voltage Vout. In some cases, it may be beneficial to provide a larger reference current IR from the reference current generator 110. In these cases, the control circuit 120 can provide control signals to the reference current generator to select or adjust the magnitude of the reference current.

The control circuit 120 can also be coupled to the phase generator 118. The control circuit 120 can measure the output voltage Vout and can control the phase generator 118 to adjust the clock signals CLK and CLKN to reduce or increase Vout. Thus, the control circuit 120 may also include a voltage regulator.

Figure 3:
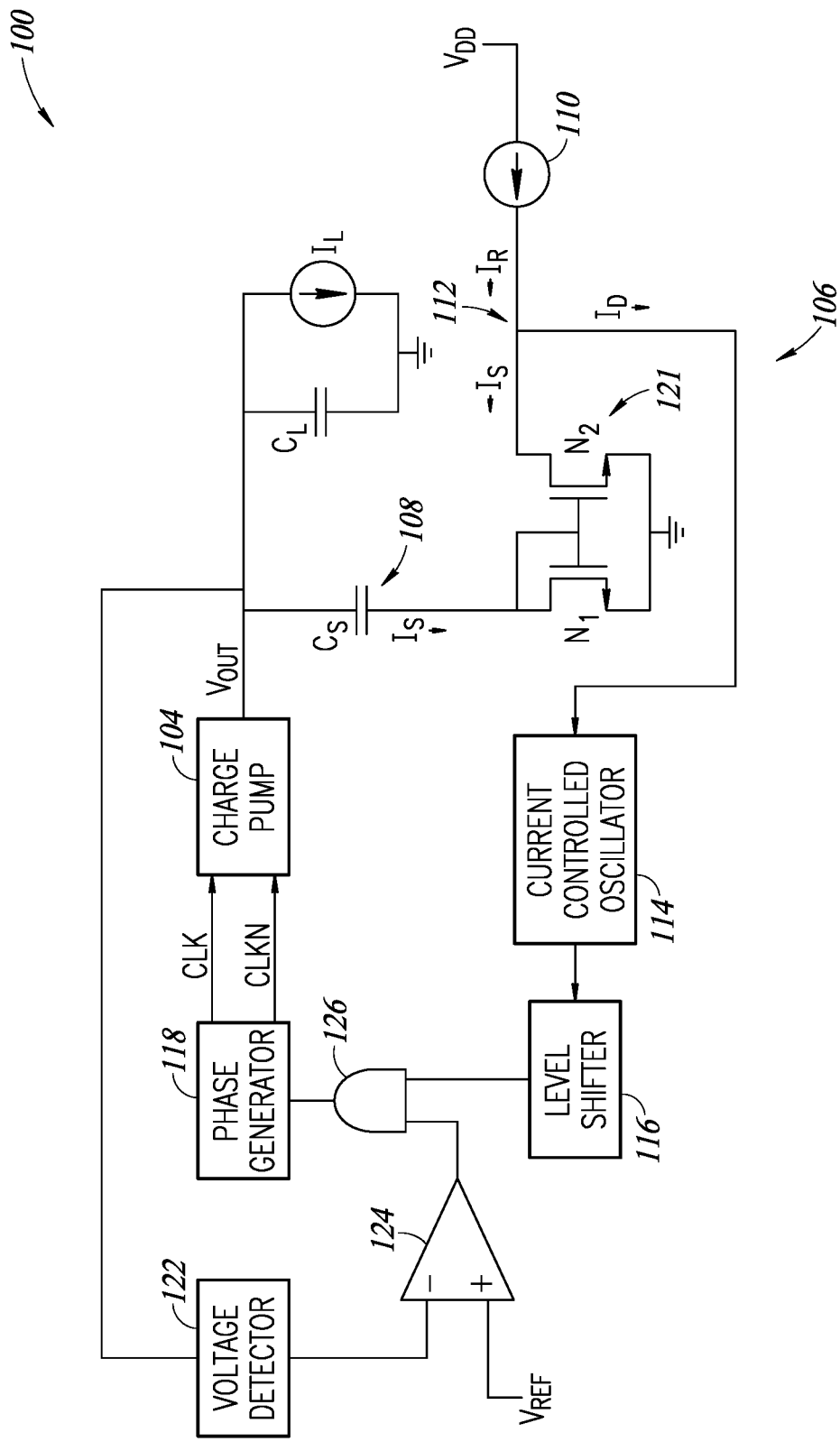
FIG. 3 is a schematic diagram of an integrated circuit including a charge pump regulator, according to one embodiment.

FIG. 3 is a schematic diagram of an integrated circuit 100 including charge pump 104 and a charge pump regulator 106. The charge pump regulator 106 can include a sense current generator 108, a reference current generator 110, the current differentiator 112, and a clock generator 113. The charge pump regulator controls the charge pump 104.

In FIG. 3, the sense current generator 108 includes a sense capacitor CS and a current mirror 121. As the output voltage Vout of the charge pump 104 changes, the voltage across the sense capacitor CS also changes. As the voltage on the sense capacitor changes, a corresponding sense current IS flows into or out of the sense capacitor, in accordance with the equation:

$$dV/dt = IS/C,$$

where dV/dt is the change in voltage across the plates of the capacitor with respect to time, IS is the current flowing into or out of the capacitor, and C is the capacitance of the capacitor. dV/dt is also the slew rate of the output voltage Vout of the charge pump 104. Rearranging the equation, the sense current IS is given by the following relationship:

$$IS = C*dV/dT.$$

Accordingly, the slew rate of the charge pump 104 forces the sense current IS to flow into or out of the sense capacitor CS. The current mirror 121 includes the NMOS transistors N1 and N2 coupled together in a current mirror configuration. The gate terminals of the transistors N1 and N2 are coupled together. The source terminals of the transistors N1 and N2 are coupled to ground. The drain terminal of the transistor N1 is coupled to the gate terminal of the transistors N1 and N2. The result of this configuration is that the voltage of the gate terminals of N1 and N2 will be forced to the value that provides a gate to source voltage VGS that results in a drain current to the value of IS. Because the gate terminals of the transistors N1 and N2 and the source terminals of the transistors N1 and N2 are coupled together, the gate to source voltage VGS in the transistor N2 is equal to the gate to source voltage in the transistor N1. Thus, the current IS will also flow through the transistor N2.

The drain terminal of the transistor N2 is coupled to a reference current generator 110. The reference current generator is configured as a current source that outputs a reference current IR. The current differentiator 112 corresponds to a branching circuit noted between the drain of the transistor N2 and the reference current generator 110. Because IS will flow through the transistor N2, if IR is greater than IS, then the difference current ID equal to the difference between IR and IS will flow out of the node 112 into the current control oscillator 114. If IR is less than IS, then the direction of ID will be reversed and the difference current will flow out of the current control oscillator 114 into the current differentiator node 112 and into the transistor N2 as part of the sense current IS.

As set forth above, the value of the current ID controls the frequency of the oscillating signal output from the current control oscillator 114. The difference current ID can flow in either direction depending on if IS is greater than or less than IR. In this way, the sense current than the reference current IR control the frequency of the current control oscillator 114.

In FIG. 3, the integrated circuit 100 also includes a voltage detector 122, a comparator 124, and an AND gate 126. The voltage detector 122 detects the output voltage Vout of the charge pump 104. The voltage detector 122 includes a voltage divider that provides the divided voltage by dividing Vout. The voltage detector 122 can include a resistive voltage divider or capacitive voltage divider. The divided voltage is provided to the comparator 124. The comparator 124 also receives a reference voltage Vref. The comparator 124 compares Vref to the divided voltage. In this way, the comparator 124 effectively compares Vout to Vref. The comparator 124 outputs a comparison signal to the AND gate 126. If the divided voltage is greater than Vref, then the output of the comparator 124 is low. If the divided voltage is less than Vref, then the output of the comparator is high. Accordingly, the comparator outputs a signal indicating whether Vout is higher or lower than a desired value. The AND gate 126 also receives the level shifted oscillating signal from the level shifter 116.

The AND gate 126 outputs a high voltage when both inputs are high. The AND gate 126 outputs a low-voltage when either of the inputs are low. If the output of the comparator is high, then the output of the AND gate 126 will mirror the level shifted oscillating signal. Whenever the level shifted oscillating signal is high, the output of the AND gate 126 is high. Whenever the level shifted oscillating signal is low, the output of the AND gate 126 is low. However, if the output of the comparator 124 is low, then the output of the AND gate will be low.

One effect of the configuration of the voltage detector 122, the comparator 124, and the AND gate 126 is that anytime that Vout is higher than a desired voltage (i.e., anytime the divided voltage is higher than Vref), then the phase generator 118 will not output the clock signal CLK and CLKN because the level shifted oscillating voltage is not passed from the AND gate 126 to the phase generator 118 because the output of the comparator 124 is low. This will cause the output voltage Vout of the charge pump 104 to gradually drop because the charge pump 104 cannot generate the high voltage without the clock signals CLK and CLKN. In this way, the voltage detector 122 and the comparator 124 act as a voltage regulator that regulates the output voltage Vout of the charge pump 104. As long as Vout is less than the selected value determined by the relationship between the divided voltage and Vref, then the output of the comparator 124 will be high and the AND gate 126 will pass the level shifted oscillating signal from the level shifter 116 to the phase generator 118. This in turn will cause the phase generator 118 to output the clock signals CLK and CLKN to the charge pump 104.

In FIG. 3, the load of the charge pump 104 is modeled as a load capacitance CL and a load current IL. In practice, the load current of the charge pump 104 may correspond to the memory array 102 shown in FIGS. 1 and 2. Alternatively, charge pump 104 may output the high-voltage Vout to a load other than a memory array without departing from the scope of the present disclosure.

Figure 4:
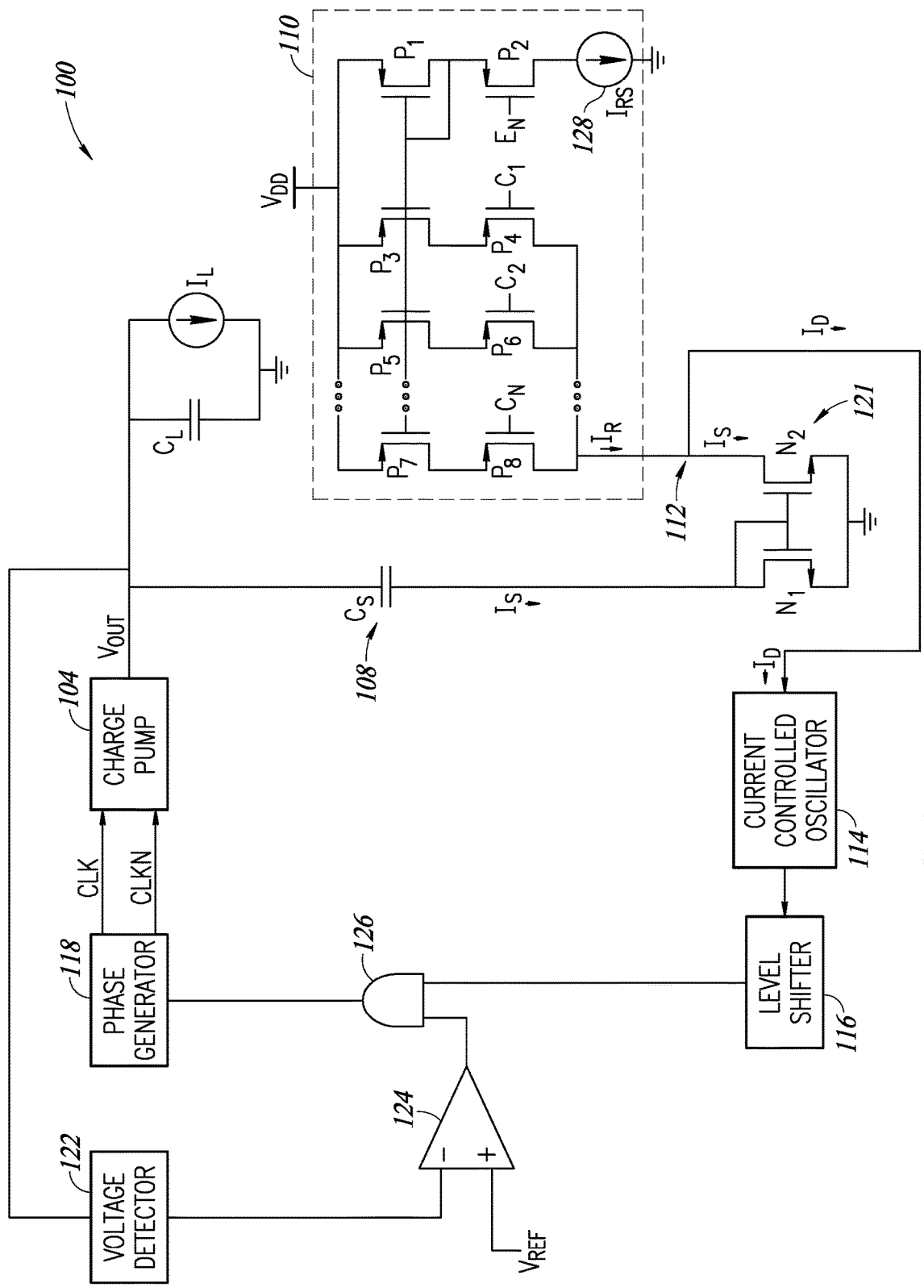
FIG. 4 is a schematic diagram of an integrated circuit including a charge pump regulator, according to one embodiment.

FIG. 4 is a schematic diagram of an integrated circuit 100 including a charge pump 104 and the charge pump regulator 106, according to one embodiment. The integrated circuit 100 of FIG. 4 is substantially similar to the integrated circuit 100 of FIG. 3, except that the reference current generator 112 is different. The reference current generator 112 includes a current source 128. The current source 128 generates a reference seed current. The reference current generator 112 generates the reference current IR based on the reference seed current and control signals provided by the control circuit 120 shown in FIG. 2.

Reference current generator 112 includes PMOS transistors P1 and P2. The source terminal of the transistor P1 is coupled to the supply voltage VDD. The gate terminal of the transistor P1 is coupled to the drain terminal of the transistor P1 and the source terminal of the transistor P2. The gate terminal of the transistor P2 receives an enable signal EN that enables the reference current generator 112. The drain terminal of the transistor P2 is coupled to the current source 128.

When the enable signal EN is low, the reference seed current IRS flows through the transistors P1 and P2. Because the drain terminal of the transistor P1 is coupled to the gate terminal of the transistor P1, the gate voltage of the transistor P1 will settle at a voltage that results in a gate to source voltage with a value that drives the reference seed voltage IRS through the transistor P1.

The reference current generator 112 includes N current mirror paths each coupled to the transistor P1 in a current mirror configuration. The first current mirror path includes the transistors P3 and P4. The transistor P3 is coupled to the transistor P1 in a current mirror configuration. The transistor P4 is coupled between the transistor P3 and the current differentiator node 112. The gate terminal of the transistor P4 receives the control signal C1 that selectively enables or disables the transistor P4, thereby selectively enabling or disabling the first current mirror path of the reference current generator 110. The second current mirror path includes the transistors P5 and P6. The transistor P5 is coupled to the transistor P1 of the current mirror configuration. The gate terminal of the transistor P6 receives the control signal C2 that selectively enables or disables the transistor P6. The transistor P6 is coupled between the transistor P5 and the current differentiator node 112. The Nth current mirror path includes the transistors P7 and P8. The transistor P7 is coupled to the transistor P1 and a current mirror configuration. The transistor P8 receives the control signal CN that selectively enables or disables the Nth current mirror path.

Each enabled current mirror path passes a current equal to the reference seed current IRS because of the current mirror configurations. The reference current IR is equal to the reference seed current IRS multiplied by the number of enabled current mirror paths. Thus, if all N current mirror paths are enabled, then IR will be equal to N*IRS. If only one current mirror path is enabled, the IR will be equal to IRS. The sense current IS can be generated substantially as described in relation to FIG. 3.

Figure 5:
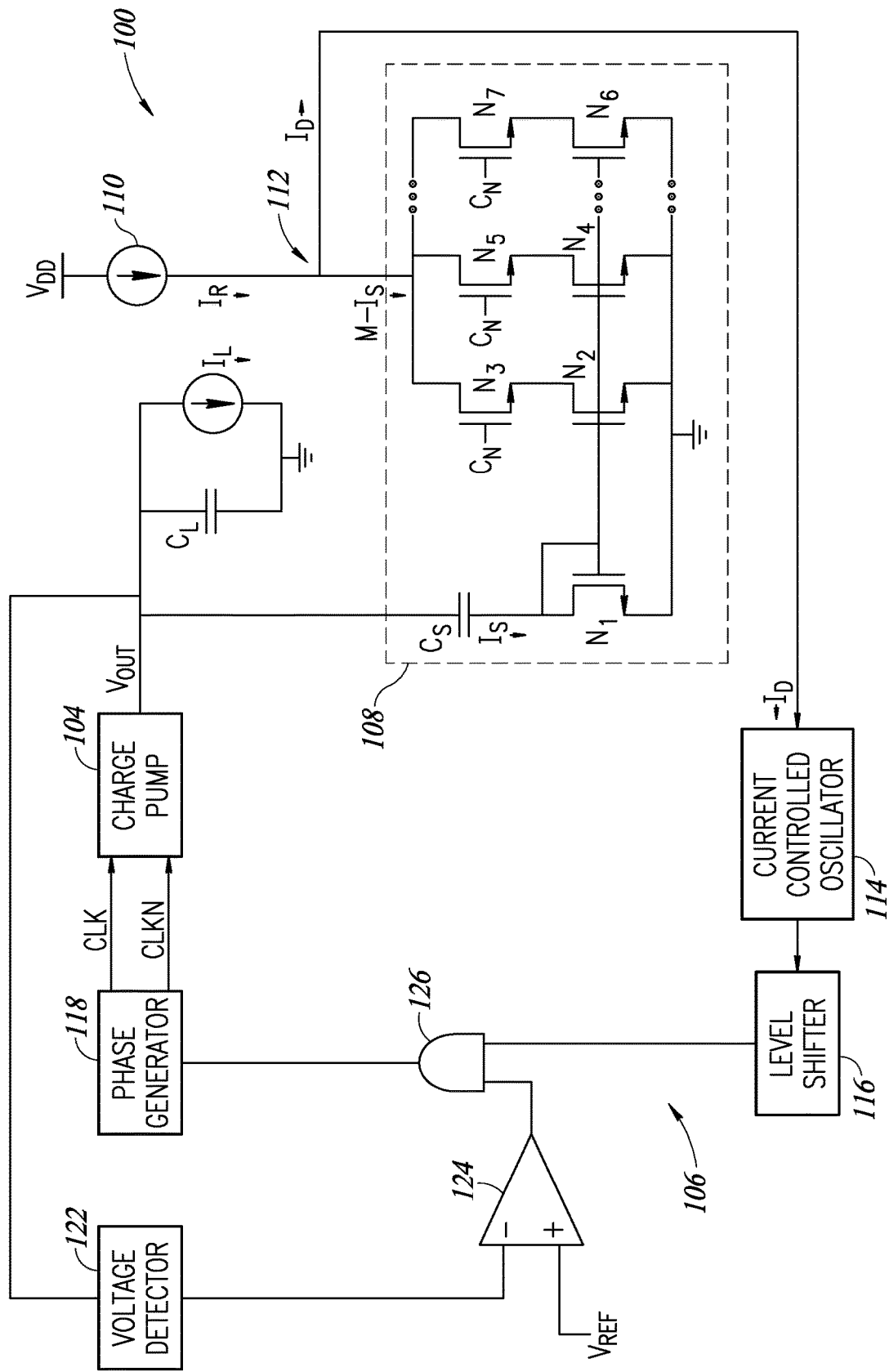
FIG. 5 is a schematic diagram of an integrated circuit including a charge pump regulator, according to one embodiment.

FIG. 5 is a schematic diagram of an integrated circuit 100 including a charge pump 104 and the charge pump regulator 106, according to one embodiment. The integrated circuit 100 of FIG. 5 is substantially similar to the integrated circuit 100 of FIG. 3, except with regards to the sense current generator 108. The sense current generator 108 generates a sense current IS based on the sense capacitor CS and the current mirror transistor N1 as described in relation to FIG. 3. However, the sensor generator 108 also includes N current mirror paths that can each be selectively enabled to pass the sense current IS. The current mirror paths can be selectively enabled by control signals provided by the control circuit 120 shown in FIG. 2.

The first current mirror path includes the transistors N2 and N3. The transistor N2 is coupled to the transistor N1 in a current mirror configuration. The transistor N3 is coupled between the transistor N2 and the current differentiator node 112. The gate terminal of the transistor N3 receives the control signal C1 that selectively enables or disables the transistor N3, thereby selectively enabling or disabling the first current mirror path of the sense current generator 108. The second current mirror path includes the transistors N4 and N5. The transistor N4 is coupled to the transistor N1 in a current mirror configuration. The gate terminal of the transistor N5 receives the control signal C2 that selectively enables or disables the transistor N5. The transistor N5 is coupled between the transistor N4 and the current differentiator node 112. The Nth current mirror path includes the transistors N6 and N7. The transistor N6 is coupled to the transistor N1 in a current mirror configuration. The transistor N7 receives the control signal CN that selectively enables or disables the Nth current mirror path.

Each enabled current mirror path passes a current equal to the sense current IS because of the current mirror configurations. A total sense current m*IS to the current mirror paths, where m is the number of enabled current mirror paths. The total sense current m*IS flows from the current differentiator node 112. The control circuit 120 can enable additional current mirror paths in the sense current generator 108 in order to increase the sensitivity of the sense current generator. The higher the number of enabled current mirror paths, the greater the total sense current generated for a given slew rate of the output voltage Vout. The lower the number of enabled current mirror paths, the lower the total sense current generated for a given slew rate of the output voltage Vout. The reference current IR and the difference current ID can be generated substantially as described in relation to FIG. 3.

Figure 6:
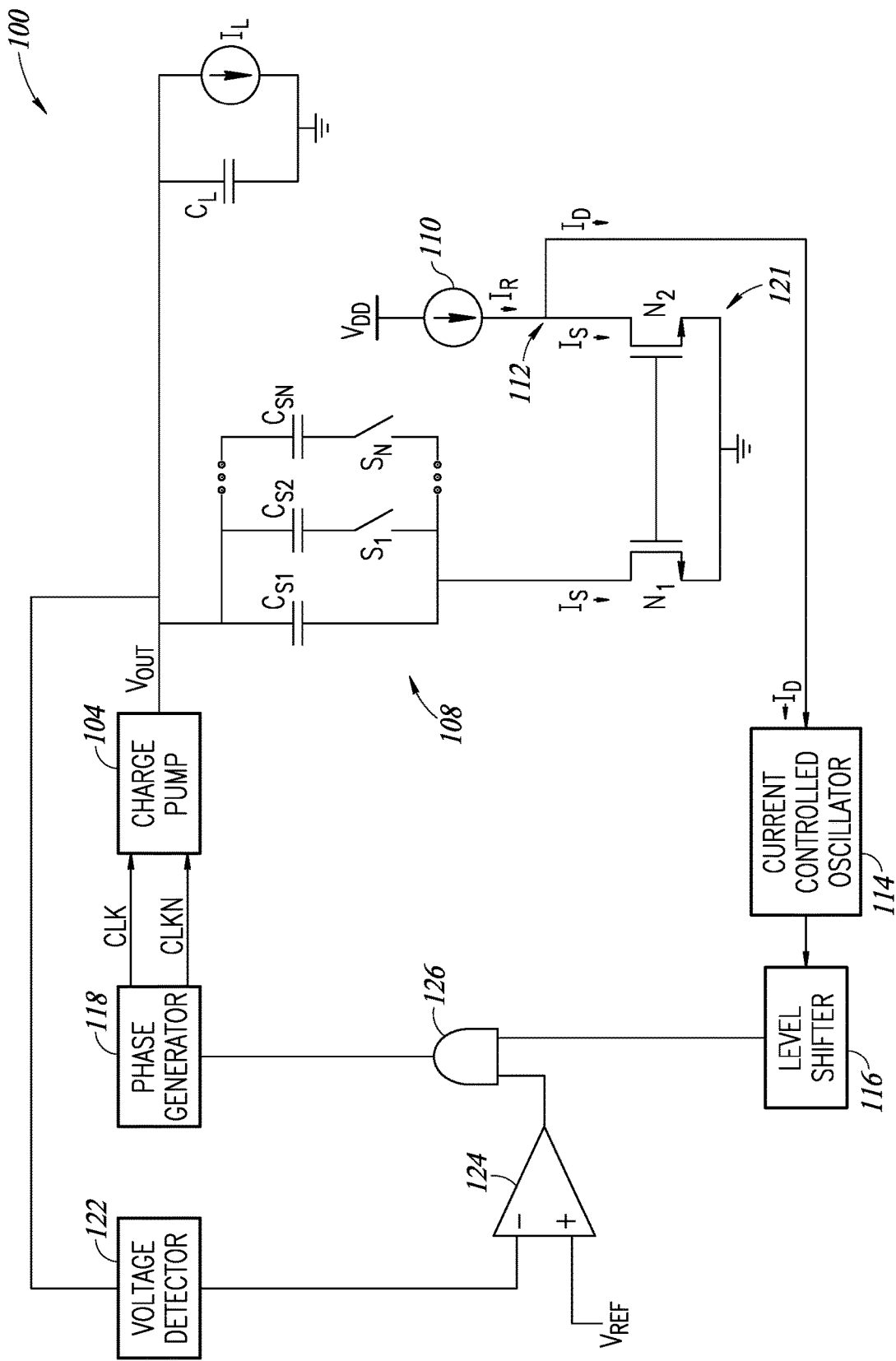
FIG. 6 is a schematic diagram of an integrated circuit including a charge pump regulator, according to one embodiment.

FIG. 6 is a schematic diagram of an integrated circuit 100 including a charge pump 104 and a charge pump regulator 106, according to one embodiment. The integrated circuit 100 of FIG. 6 is substantially similar to the integrated circuit 100 of FIG. 3, except with regards to the sense current generator 108. The sense current generator 108 includes N sense capacitors CS-CSN and a corresponding number of current paths upstream from the current mirror transistor N1.

A first selectively enabled current path includes the sense capacitor CS2 and the switch S1. The Nth selectively enabled current path includes the sense capacitor CSN. The control circuit 120 shown in FIG. 2 can selectively open and close the switches S1-SN in order to selectively enable the current path associated with each sense capacitor CS1-CSN. The control circuit 120 can selectively enable the switches S1-SN to increase or decrease the sensitivity of the sense current generator 108. The sense current IS corresponds to the sum of the currents flowing through each enabled current path. The reference current IR and the differential current ID can be generated substantially as shown and described in relation to FIG. 2.

Figure 7:
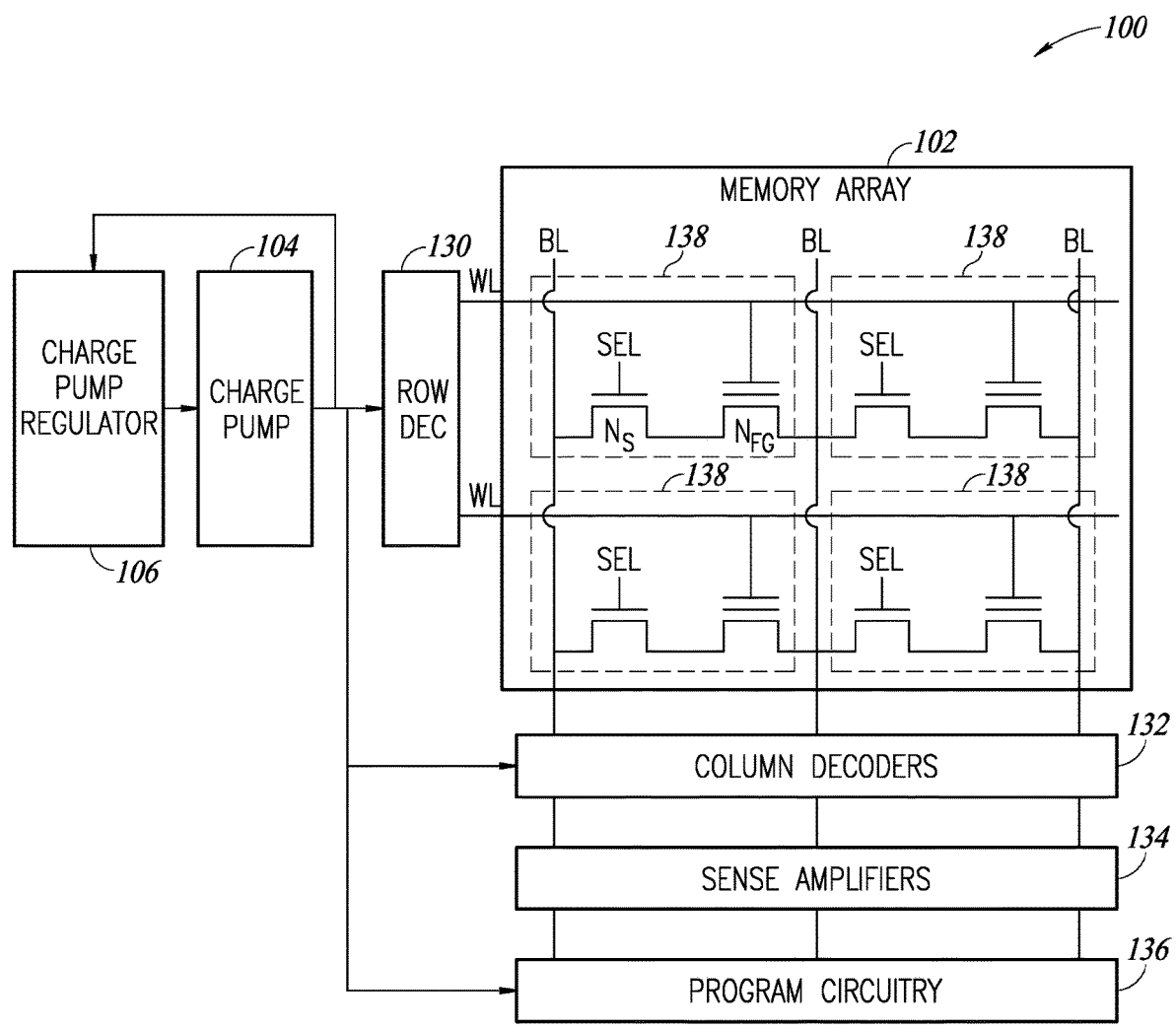
FIG. 7 is a block diagram of an integrated circuit, according to one embodiment.

FIG. 7 is a block diagram of an integrated circuit 100, according to one embodiment. The integrated circuit 100 includes a memory array 102. The memory array 102 is a non-volatile memory including a plurality of memory cells 138 arranged in rows and columns. Each memory cell 138 includes a floating gate transistor NFG and a selection transistor NS. The control gate of the floating gate transistor NFG is coupled to a wordline corresponding to the row of the memory cell 138. The selection transistor receives a selection signal SEL selecting the memory cell for a read, erase, or program operation.

The selection transistor NS and the floating gate transistor NFG of the memory cell 138 are coupled between two bitlines BL. The bitlines BL may be alternately operated as source lines. Various configurations of wordlines, bitlines, source lines, and selected lines can be utilized for the non-volatile memory array 102 without departing from the scope of the present disclosure.

The integrated circuit 100 includes a row decoder 130. The row decoder 130 receives the high voltage Vout from the charge pump 104 for a program or erase operation. The row decoder 130 then supplies a high voltage Vout to the wordlines WL associated with the rows for which a program or erase operation is to be performed.

The integrated circuit 100 also includes column decoders 132 for selecting bitlines associated with memory cells 138 for which a read, erase, or program operation is to be performed. The sense amplifiers 134 sense the value of data stored in the memory cells during read operations. The program circuitry 138 is coupled to the bitlines BL can supply voltages for performing read, erase, or program operations.

Though not shown in FIG. 7, additional voltage step down circuitry can be provided to reduce the magnitude of the output voltage supplied to the column decoders 132 and program circuitry 136 from the charge pump 104. For example, if the output voltage of the charge pump 104 is between 15 V and 20 V, the step down circuitry may provide between 5 V and 10 V to the column decoders 132 and the program circuitry 136. The charge pump regulator 106 operates substantially as described previously in relation to FIGS. 1-6.

Figure 8:
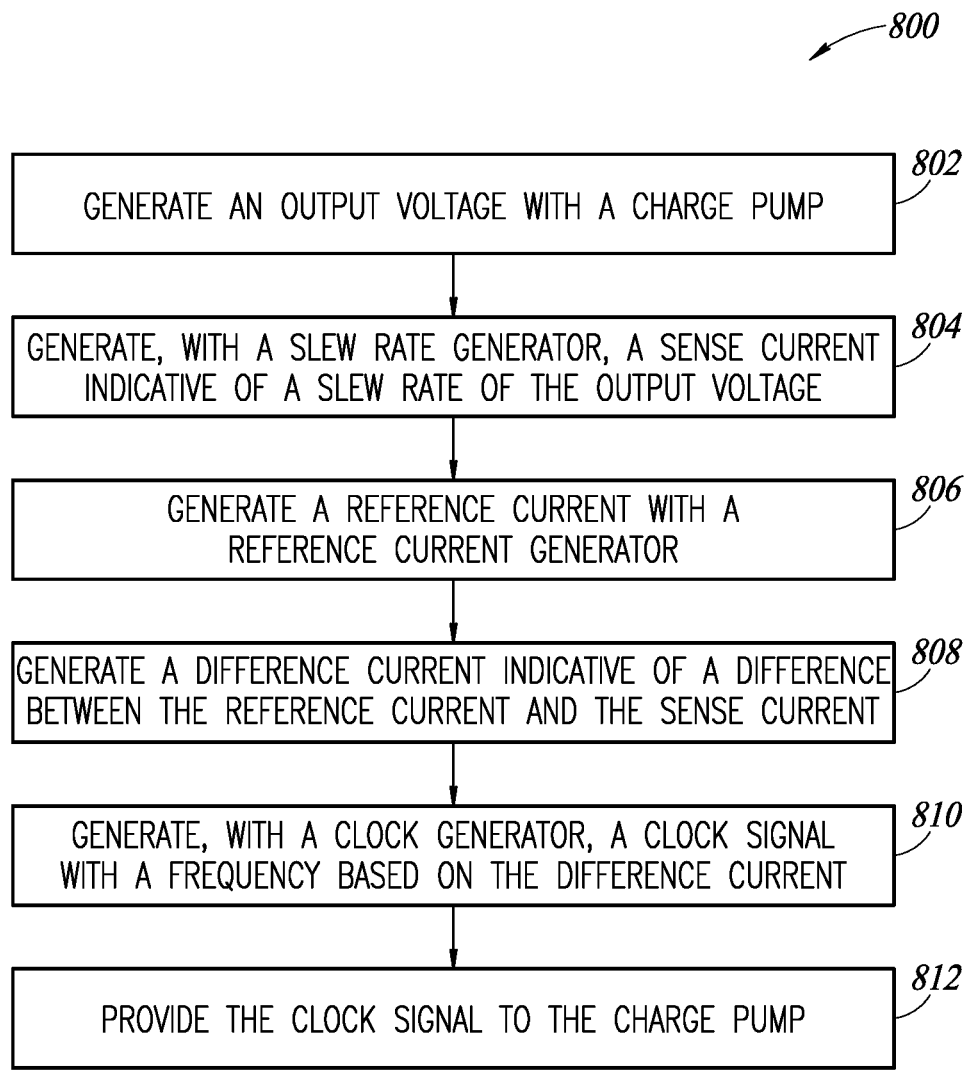
FIG. 8 is a flow diagram of a method 800 for operating an integrated circuit, according to one embodiment.

FIG. 8 is a flow diagram of a method 800 for operating an integrated circuit, according to one embodiment. The method 800 can utilize any of the circuits, components, and processes described in relation to FIGS. 1-7. At 802, the method 800 includes generating an output voltage with a charge pump. At 804, the method 800 includes generating, with a slew rate generator, a sense current indicative of a slew rate of the output voltage. At 806, the method 800 includes generating a reference current with a reference current generator. At 808, the method 800 includes generating a difference current indicative of a difference between the reference current and the sense current. At 810, the method includes generating, with a clock generator, a clock signal with a frequency based on the difference current. At 812, the method includes providing the clock signal to the charge pump.

In one embodiment, an integrated circuit includes a charge pump configured to receive a supply voltage and to provide an output voltage higher than the supply voltage. The integrated circuit includes a charge pump regulator coupled to the charge pump. The charge pump regulator includes a sense current generator coupled to the charge pump and configured to generate a sense current indicative of a slew rate of the output voltage, a reference current generator configured to generate a reference current, and a current differentiator configured to receive the sense current and the reference current and to generate a difference current indicative of a difference between the sense current and the reference current. The charge pump regulator also includes a clock generator configured to generate a clock signal with a frequency based on the difference current and to provide the clock signal to the charge pump.

In one embodiment, an integrated circuit includes a memory array including a plurality of memory cells, a charge pump having an output coupled to the memory array, a sense current generator coupled to the output of the charge pump, a reference current generator, and a current differentiator. The current differentiator includes a first input coupled to the sense current generator, a second input coupled to the reference current generator, and an output. The charge pump regulator includes a clock generator coupled to the charge pump and having current controlled oscillator coupled to an output of the current differentiator.

In one embodiment, a method includes generating an output voltage with a charge pump, generating, with a slew rate generator, a sense current indicative of a slew rate of the output voltage, and generating a reference current with a reference current generator. The method includes generating a difference current indicative of a difference between the reference current and the sense current, generating, with a clock generator, a clock signal with a frequency based on the difference current, and providing the clock signal to the charge pump.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   a charge pump configured to receive a supply voltage and to provide an output voltage higher than the supply voltage; and
   a charge pump regulator coupled to the charge pump and including:
      a sense current generator coupled to the charge pump and configured to generate a sense current indicative of a slew rate of the output voltage, wherein the sense current generator includes:
         a first transistor having a source terminal coupled to ground, a gate terminal, and a drain terminal coupled to the gate terminal;
         a plurality of sense capacitors each having a first terminal coupled to an output terminal of the charge pump and a second terminal; and
         a plurality of switches each coupled between to the second terminal of a respective sense capacitor and the drain terminal of the first transistor and configured to enable the corresponding sense capacitor to participate in generating the sense current;
      a second transistor having a source terminal coupled to ground, a drain terminal, and a gate terminal coupled to the gate terminal of the first transistor;
      a reference current generator coupled between a high supply voltage and a drain of the second transistor and configured to generate a reference current;
      a clock generator configured to generate a clock signal with a frequency based on a difference current corresponding to a difference between the reference current and the sense current and to provide the clock signal to the charge pump, the clock generator including:
         a current controlled oscillator having an input directly coupled to the drain terminal of the second transistor and that receives, from the drain terminal of the second transistor, wherein the current controlled oscillator generates an oscillating signal with a frequency based on the difference current; and
         a level shifter configured to shift a level of the oscillating signal.

2. The integrated circuit of claim 1, wherein the sense current corresponds to a charging current of the capacitor.

3. The integrated circuit of claim 2, wherein the charging current corresponds to the slew rate of the output voltage.

4. The integrated circuit of claim 1, the sense current generator including a plurality of parallel sense current paths coupled together in a current mirror configuration that can be selectively enabled to adjust a sensitivity of the sense current generator.

5. The integrated circuit of claim 4, further comprising a control circuit that selectively enables the plurality of parallel sense current paths based on a load of the charge pump.

6. The integrated circuit of claim 1, the reference current generator including a plurality of parallel reference current paths coupled together in a current mirror configuration and that can be selectively enabled to adjust the reference current.

7. An integrated circuit, comprising:
   a memory array including a plurality of memory cells;
   a charge pump having an output and coupled to the memory array;

a sense current generator coupled to the output of the charge pump, wherein the sense current generator includes:
  a first transistor having a source terminal coupled to ground, a gate terminal, and a drain terminal coupled to the terminal;
  a plurality of sense capacitors each having a first terminal coupled to an output terminal of the charge pump and a second terminal; and
  a plurality of switches each coupled between the second terminal of a respective sense capacitor the drain terminal of the first transistor and configured to enable the corresponding sense capacitor to participate in generating a sense current;
  a second transistor having a source terminal coupled to ground, a gate terminal coupled to the gate terminal of the first transistor, and a drain terminal;
a reference current generator coupled between a high supply voltage and a drain terminal of the second transistor and configured to generate a reference current;
a clock generator coupled to the charge pump and including:
  a current controlled oscillator having an input directly coupled to the drain terminal of the second transistor and that receives, from the drain terminal of the second transistor, a difference current corresponding to a difference between the reference current and the sense current, wherein the current controlled oscillator generates an oscillating signal with a frequency based on the different current; and
  a level shifter coupled to the output of the current controlled oscillator.

8. The integrated circuit of claim 7, wherein the clock generator includes a phase generator that receives a level shifted oscillating signal from the level shifter, generates a clock signal from the oscillating signal, and provides the clock signal to the charge pump.

9. The integrated circuit of claim 8, further comprising:
a voltage divider having:
  an input coupled to the output of the charge pump and configured to receive the output voltage of the charge pump; and
  an output configured to provide a divided voltage from the output voltage;
a comparator having:
  a first input coupled to the output of the voltage divider and configured to receive the divided voltage;
  a second input configured to receive a reference voltage; and
  an output configured to output a comparison signal; and
a logic gate having:
  a first input configured to receive the oscillating signal;
  a second input configured to an output of the comparator; and
  an output configured to provide or not provide the oscillating signal to the phase generator based on the value of the comparison signal.

10. A method, comprising:
generating an output voltage with a charge pump;
generating, with a slew rate generator, a sense current indicative of a slew rate of the output voltage, wherein the sense current generator includes:
  a first transistor having a source terminal coupled to ground, a gate terminal, and a drain terminal coupled to the gate terminal;
  a plurality of sense capacitors each having a first terminal coupled to an output terminal of the charge pump and a second terminal; and
  a plurality of switches each coupled between the second terminal of a respective sense capacitor and the drain terminal of the first transistor and configured to enable the corresponding sense capacitor to participate in generating the sense current;
  a second transistor having a source terminal coupled to ground, a gate terminal coupled to the gate terminal of the first transistor, and a drain terminal;
generating a reference current with a reference current generator coupled between a high supply voltage and a drain terminal of the second transistor;
generating, with a clock generator, a clock signal with a frequency based on the difference current, wherein generating the clock signal includes:
  receiving, with an input of a current controlled oscillator directly coupled to the drain terminal of the second transistor, a difference current corresponding, to a difference between the reference current and the sense current;
  generating, with the current controlled oscillator, an oscillating signal with a frequency based on the difference current; and
  shifting a level of the oscillating signal with a level shifter; and
providing the clock signal to the charge pump.

11. The method of claim 10, further comprising adjusting the slew rate of the output voltage by adjusting the frequency of the clock signal based on the sense current.

12. The method of claim 10, wherein adjusting the frequency of the clock signal includes adjusting a frequency of the oscillating signal based on the difference current.

13. The method of claim 10, further comprising adjusting a proportionality of the sense current to the slew rate by selectively enabling parallel current paths of the sense current generator.

14. The method of claim 10, further comprising adjusting a proportionality of the sense current to the slew rate by selectively enabling parallel current paths of the reference current generator.

15. The method of claim 10, further comprising supplying the output voltage to a non-volatile memory array.

16. The method of claim 15, further comprising programming a non-volatile memory cell of the memory array by applying the output voltage to a control gate of a floating gate transistor of the memory cells.

17. The device of claim 1, wherein the clock generator includes a phase generator coupled to an output of the level shifter and configured to supply the clock signal and a complimentary clock signal.

18. The method of claim 10, comprising generating a complimentary clock signal with the clock generator.

* * * * *

UNITED STATES PATENT AND TRADEMARK OFFICE
CERTIFICATE OF CORRECTION

PATENT NO. : 11,881,280 B2
APPLICATION NO. : 17/534136
DATED : January 23, 2024
INVENTOR(S) : Shivam Kalla et al.

It is certified that error appears in the above-identified patent and that said Letters Patent is hereby corrected as shown below:

In the Claims

Column 12, Claim 1, Line 20:
"coupled between to the" should read: --coupled between the--.

Column 13, Claim 7, Line 6:
"to the terminal;" should read: --to the gate terminal;--.

Signed and Sealed this
Sixteenth Day of April, 2024

Katherine Kelly Vidal
*Director of the United States Patent and Trademark Office*